United States Patent
Fung et al.

(10) Patent No.: US 6,506,649 B2
(45) Date of Patent: Jan. 14, 2003

(54) METHOD FOR FORMING NOTCH GATE HAVING SELF-ALIGNED RAISED SOURCE/DRAIN STRUCTURE

(75) Inventors: Ka Hing Fung, Beacon, NY (US); Atul C. Ajmera, Wappingers Falls, NY (US); Victor Ku, Tarrytown, NY (US); Dominic J. Schepis, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 81 days.

(21) Appl. No.: 09/811,706

(22) Filed: Mar. 19, 2001

(65) Prior Publication Data

US 2002/0132431 A1 Sep. 19, 2002

(51) Int. Cl.⁷ .......................... H01L 21/336
(52) U.S. Cl. .............. 438/300; 438/182; 438/197; 438/286; 438/303; 438/306; 438/592; 438/595; 438/652
(58) Field of Search ................. 438/182, 197, 438/229, 230, 286, 299, 300, 301, 302, 303, 305, 306, 574, 579, 585, 592, 595, 652, 655, 673, 701

(56) References Cited

U.S. PATENT DOCUMENTS 4,074,300 A * 2/1978 Sakai et al. ............... 257/387

\* cited by examiner

Primary Examiner—Chandra Chaudhari
Assistant Examiner—Jack Chen
(74) Attorney, Agent, or Firm—H. Daniel Schnurmann

(57) ABSTRACT

An innovative MOSFET having a raised source drain (RSD) is constructed prior to implanting source-drain dopants. The RSD structure thus built has a distinct advantage in that the offset from the RSD to the MOSFET channel is fully adjustable to minimize the overlap capacitance in the device. The RSD construction uses a selective epitaxial process to effectively reduce the drain-source resistance. This improvement is even more significant in thin-film SOI technology. Using an RSD, the film outside the channel area thickens which, in turn, reduces the parasitic resistance. The method of constructing such a structure includes the steps of: forming a notch gate on a top surface of a substrate; covering the notch gate and the top surface of the substrate with a conformal dielectric film; etching the dielectric film to expose an upper surface of the notch gate and selected exposed areas of the substrate; selectively growing silicon on the etched surface of the gate notch and on the etched surface of the substrate; implanting doping to form a drain-source area; forming spacers on the vertical walls of the notch gate; and forming a salicide on the notch gate and on the source and drain areas. The MOSFET device may be alternately be built without the formation of spacers.

13 Claims, 7 Drawing Sheets

(a)

(b)

(c)

US 6,506,649 B2

METHOD FOR FORMING NOTCH GATE HAVING SELF-ALIGNED RAISED SOURCE/DRAIN STRUCTURE

FIELD OF THE INVENTION

This invention is generally related to the fabrication of semiconductor devices, and more particularly, to MOSFET (Metal-Oxide Semiconductor Field-Effect Transistor) devices having a raised source drain region to gain additional offset control, to lower the parasitic source drain resistance and to improve the thermal management.

BACKGROUND OF THE INVENTION

It is known in the art that the parasitic source/drain resistance (Rds), i.e., the resistance between the source/drain contact and the inversion layer of a MOSFET is a hindrance to achieving maximum current drive from the MOSFET device. In order to obtain better device performance it is imperative to reduce this resistance Rds. A suggested approach to solving this problem has been to integrate a raised source-drain region (RSD) within the MOSFET device. However, constructing such a structure within a standard CMOS manufacturing process is difficult to achieve.

Several attempts have been made to construct an RSD within a MOSFET device. For instance, in U.S. Pat. No. 5,079,180, an integration process to obtain a raised source/drain transistor is described. First, a spacer is formed and is successively followed by constructing a gate stack, by the formation of a shallow extension and, finally, by the spacer. A selective epitaxy is deposited to raise the region left uncovered by the spacer. Then, a second spacer is positioned adjacent to the first thin sidewall spacer to cover the facet of the raised source-drain region. This step is followed by conventional salicide steps. Several drawbacks are associated with this approach. First, the thermal cycles in the step of constructing the spacers as in the selective epitaxy process often cause the dopant to diffuse in the extension region. The dopant diffusion degrades the transistor short channel effect. Second, with this process flow, the selective epitaxy is formed on a highly doped silicon surface. Accordingly, the highly doped surface changes the epitaxy growth rate which causes the growth rates in n-doped and p-doped to differ. Additionally, in the presence of the dopants the epitaxial surface is rougher than the epitaxial growth. It is therefore imperative that the RSD be formed on top of an undoped surface and to have the extension doping occurring after the RSD formation.

In another U.S. Pat. No. 6,087,235, a similar RSD process is described where the gate is capped during the selective epitxay process. In this manner, the selective epitaxy does not grow on the gate stack, thereby eliminating the problem associated with doping the polysilicon. However, this patent suffers from the same drawbacks associated with the first patent previously described.

In yet another related patent, U.S. Pat. 4,948,745, the fabrication of an elevated source/drain IGFET device is disclosed. A silicon substrate is divided into active and field regions by a field oxide. A gate oxide is formed over the active region and a thin layer of polycrystalline silicon and a thick of silicon nitride are deposited on the gate oxide. The polycrystalline silicon and the silicon nitride are etched to form a stacked structure with the spacers having substantially the same height as the stacked structure, in the pattern of the gate electrode. Sidewall spacers are formed on the edges of the stacked structure and the silicon nitride is removed. Polycrystalline silicon is then deposited onto the polycrystalline silicon and the exposed portions of the source and drain regions to complete the gate electrode and to form the source and drain electrodes. The selectively deposited polycrystalline silicon extends upwardly from the source and drain regions onto the field oxide. The sidewall spacers provide physical and electrical isolation between the gate electrode and the adjacent source and drain electrodes. The structure described herein is affected by the same problems as those discussed previously.

OBJECTS OF THE INVENTION

Accordingly, it is an object of the invention to minimize the parasitic source-drain resistance (Rs) of a MOSFET device by constructing a self-aligned raised source drain (RSD) structure using a selective epitaxial process prior to performing any implant step.

It is another object to construct the RSD structure with no additional thermal cycle to minimize diffusing the dopant while improving the short channel effect.

It is a further object to control the offset to minimize the overlap capacitance while optimizing the series resistance (Rs).

SUMMARY OF THE INVENTION

This invention proposes an innovative way to form a raised source drain (RSD) prior to any implant steps. The RSD structure thus built has a distinct advantage in that the offset from the RSD to the MOSFET channel is fully adjustable. In this way, the overlap capacitance in the transistor is minimized.

The raised source drain (RSD) construction uses a selective epitaxy process to effectively reduce the Rds. This improvement is even more significant in thin-film SOI technology because an ultra-thin film (<50 nm) introduces a high source drain resistance. Using an RSD, the film outside the channel area thickens which, in turn, reduces the parasitic resistance.

In a first aspect of the invention, there is provided a method of forming a MOSFET device having a raised source-drain region, the method including the steps of: a) forming a notch gate on a top surface of a substrate; b) covering the notch gate and the top surface of the substrate with a conformal dielectric film; c) etching the dielectric film to expose an upper surface of the notch gate and selected exposed areas of the substrate; d) selectively growing silicon on the etched surface of the gate notch and on the etched surface of the substrate; e) implanting doping to form a drain-source area; f) forming spacers on the vertical walls of the notch gate; and g) forming a salicide on the notch gate and on the source and drain areas.

In a second aspect of the invention there is provided a method of forming a MOSFET device having a raised source-drain region, the method including the steps of: a) forming a notch gate on a top surface of a b) covering the notch gate and the top surface of substrate with a conformal dielectric film; c) etching the dielectric film to expose an upper surface of the notch gate and selected exposed areas of the substrate; d) selectively growing silicon on the etched surface of the gate notch and on the etched surface of the substrate; e) implanting doping to form a drain-source area; and f) forming a salicide on the notch gate and on the source and drain areas.

BRIEF DESCRIPTION OF THE DRAWINGS

These and other objects, advantages and aspects of the invention will be better understood by the following detailed description of a preferred embodiment when taken in conjunction with the accompanying drawings.

FIG. 5(a) shows the manufacturing process performed in the presence of the thin film dielectric, while FIG. 5(b) shows the structure with the thin film dielectric layer completely removed prior to the source/drain implantation.

6a–6c show the final structure after formation of the spacer and salicidation, in accordance with the present invention.

DESCRIPTION OF THE PREFERRED EMBODIMENT

Figure 3:
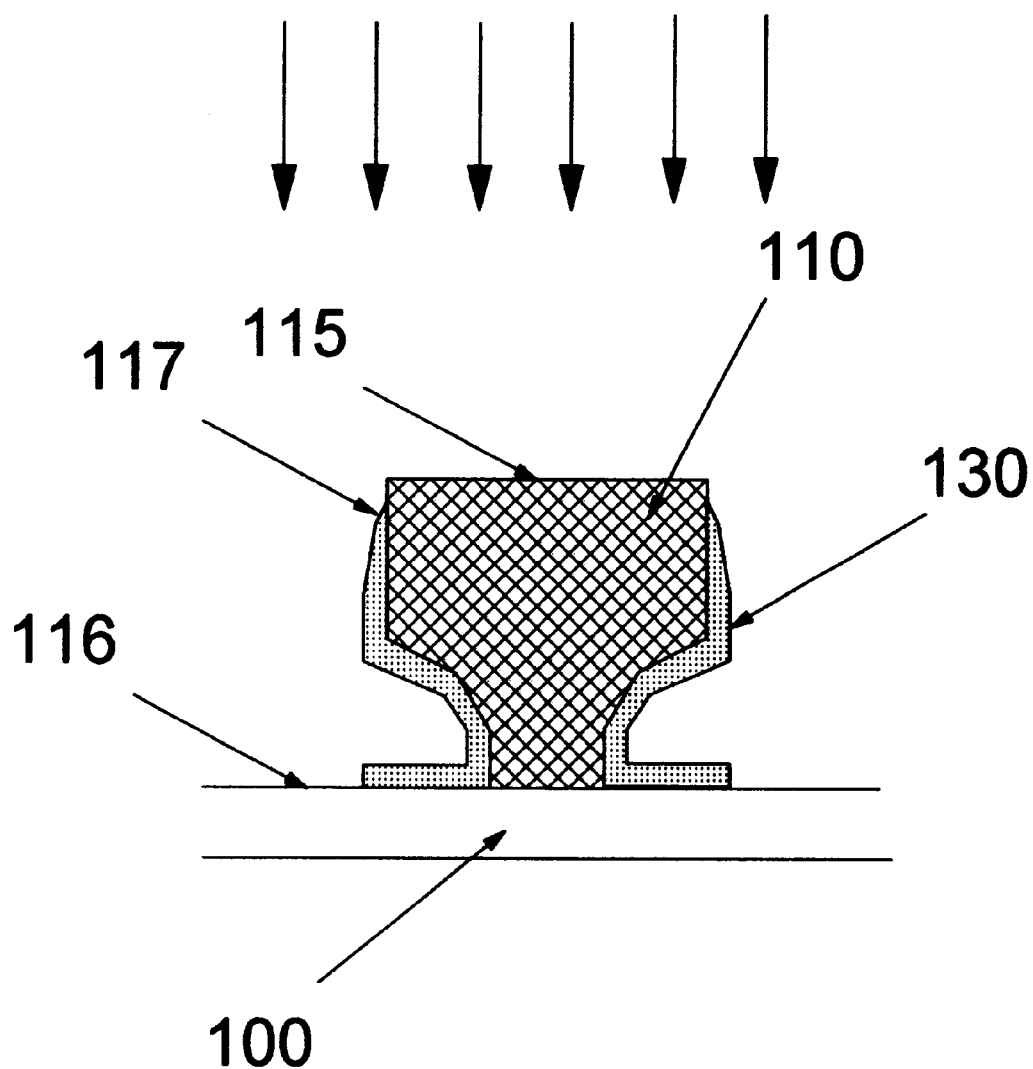
FIG. 3 shows the structure upon applying a directional etch.
Figure 4:
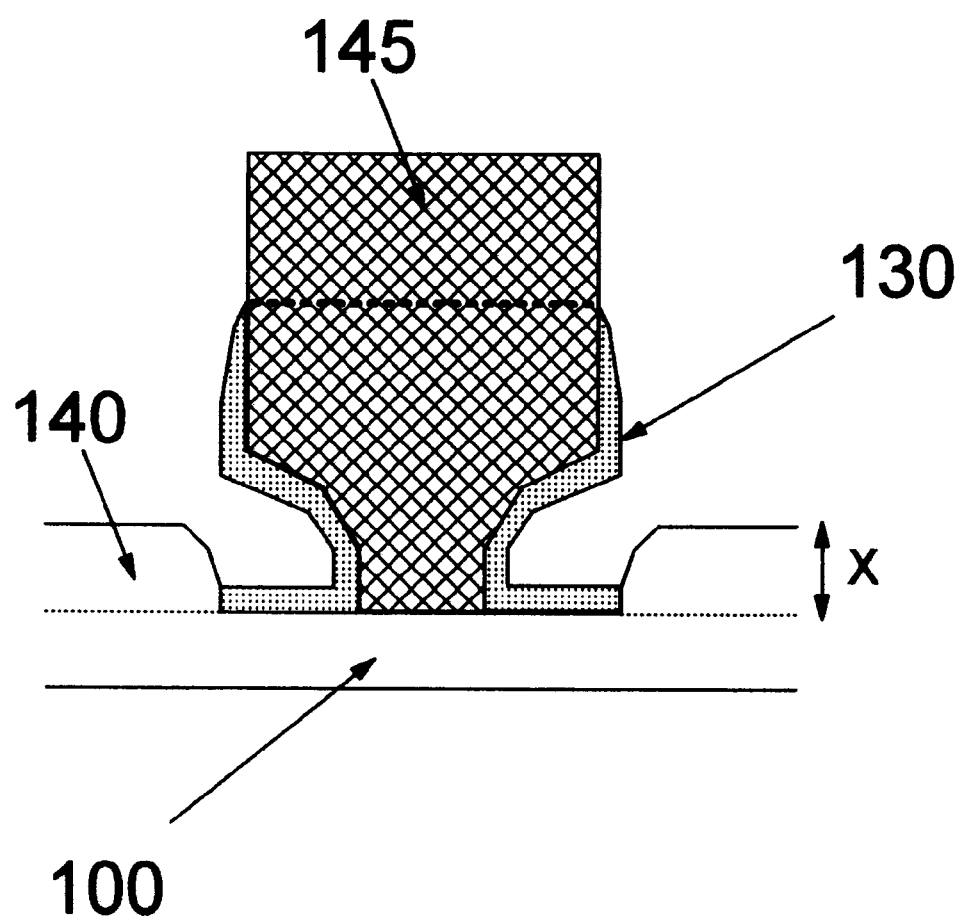
FIG. 4 shows the structure following the epitaxial growth.
Figure 5:
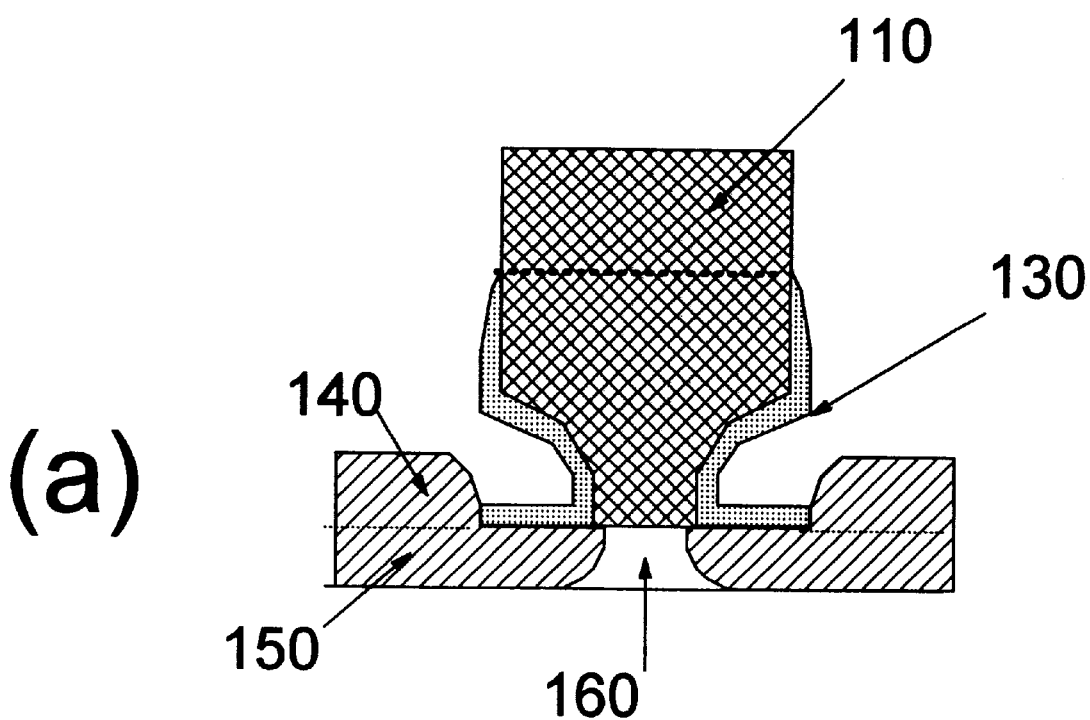
FIG. 5 shows the structure after implanting the source/drain regions. More specifically.
Figure 5:
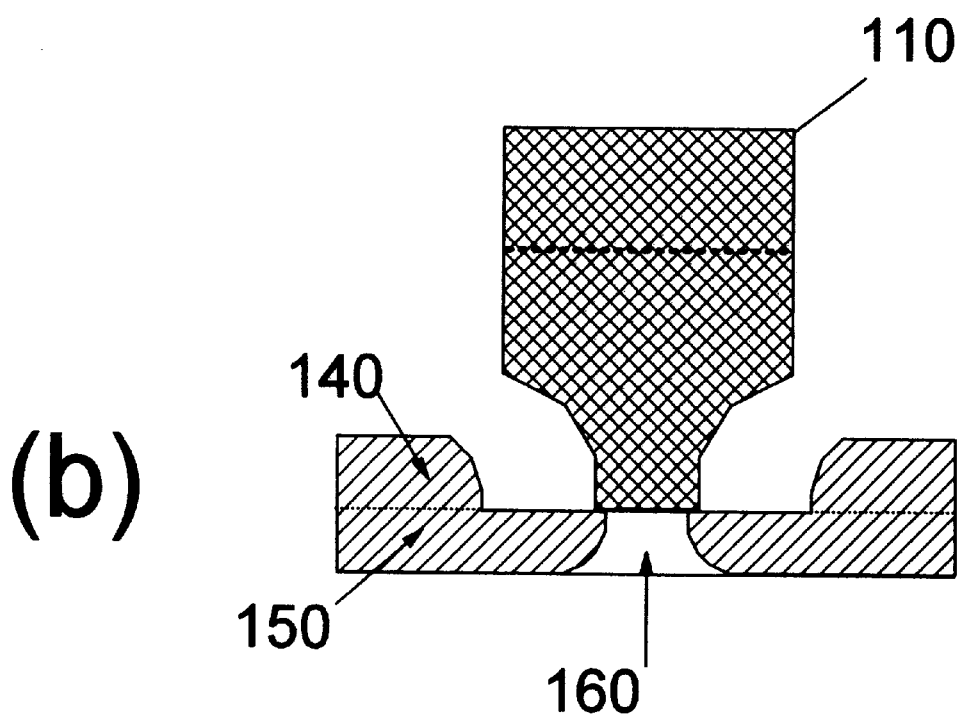
Figure 6:
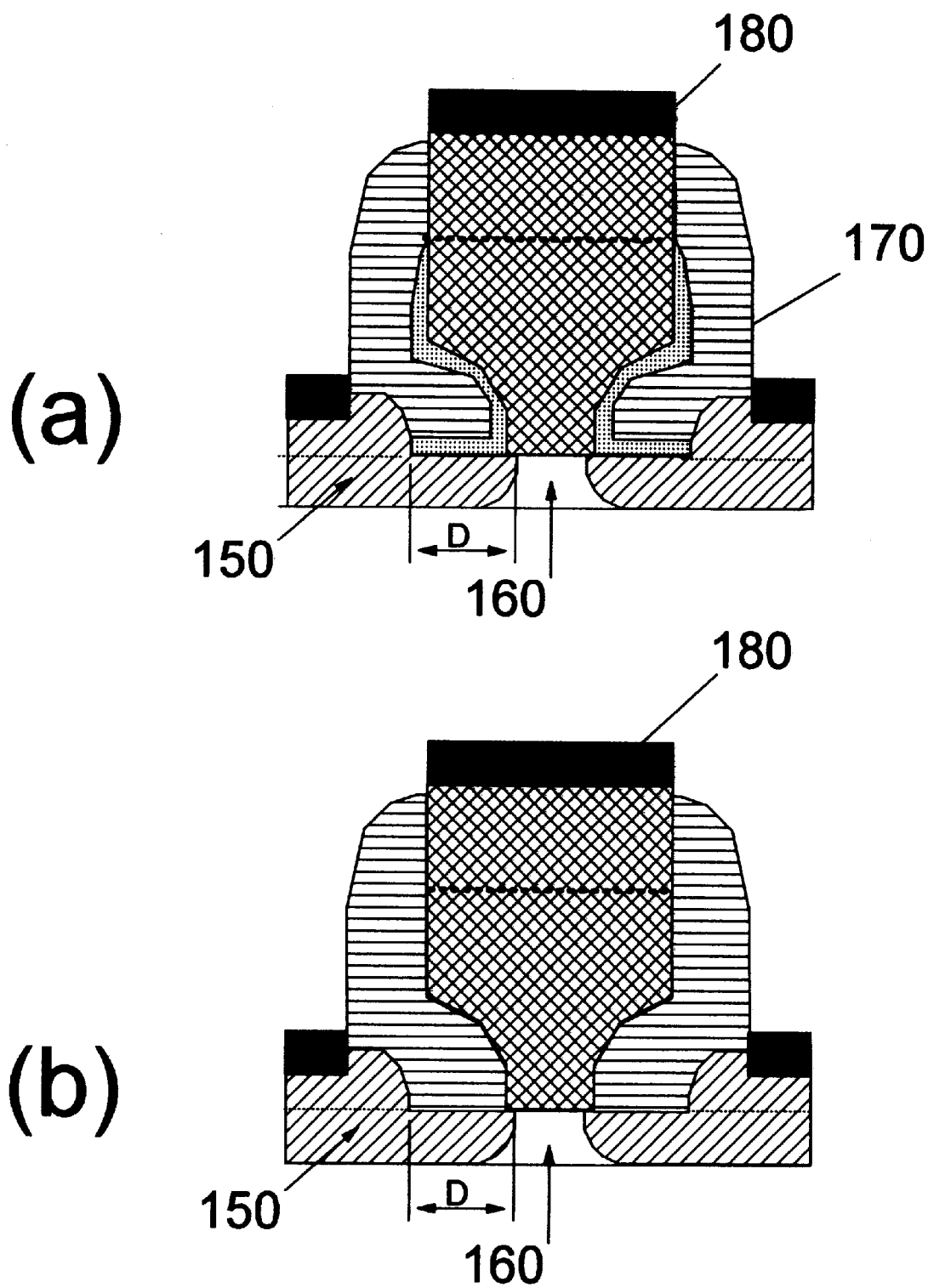
Figure 6:
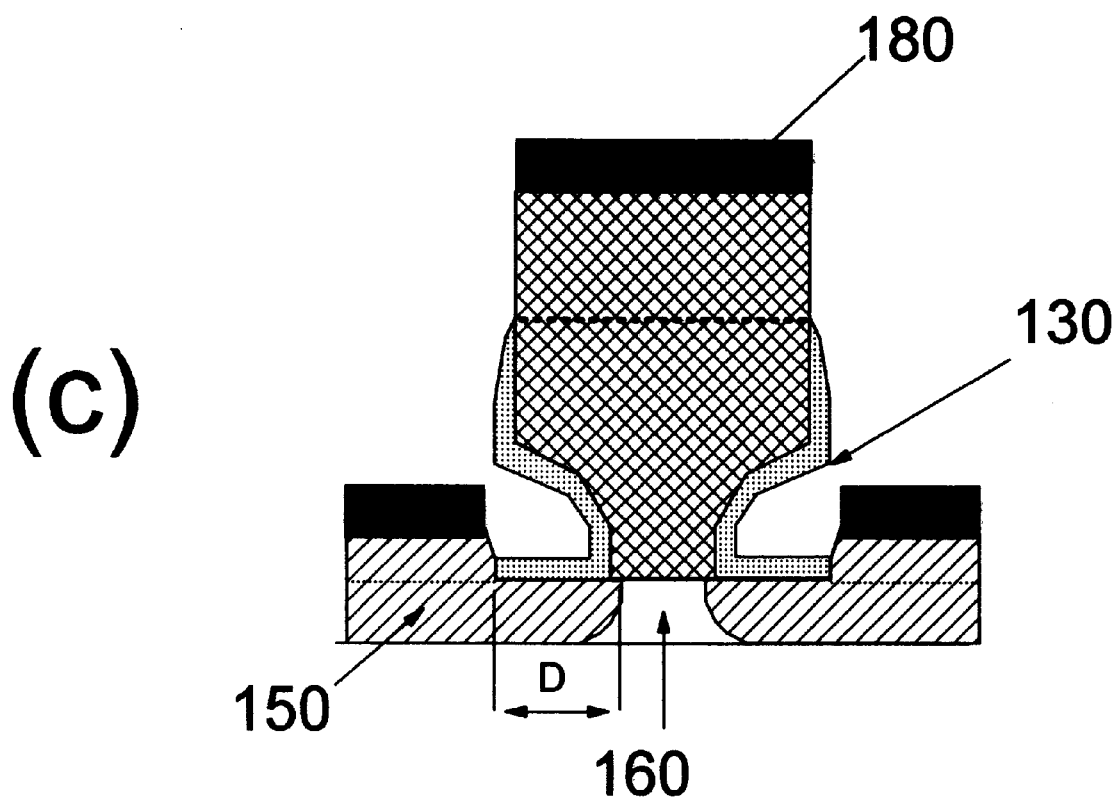

Referring now to the drawings, FIGS. 1–4 describe the construction of the raised drain-source structure, whereas FIGS. 5–6 describe the sourcedrain doping formation of the inventive structure.

Figure 1:
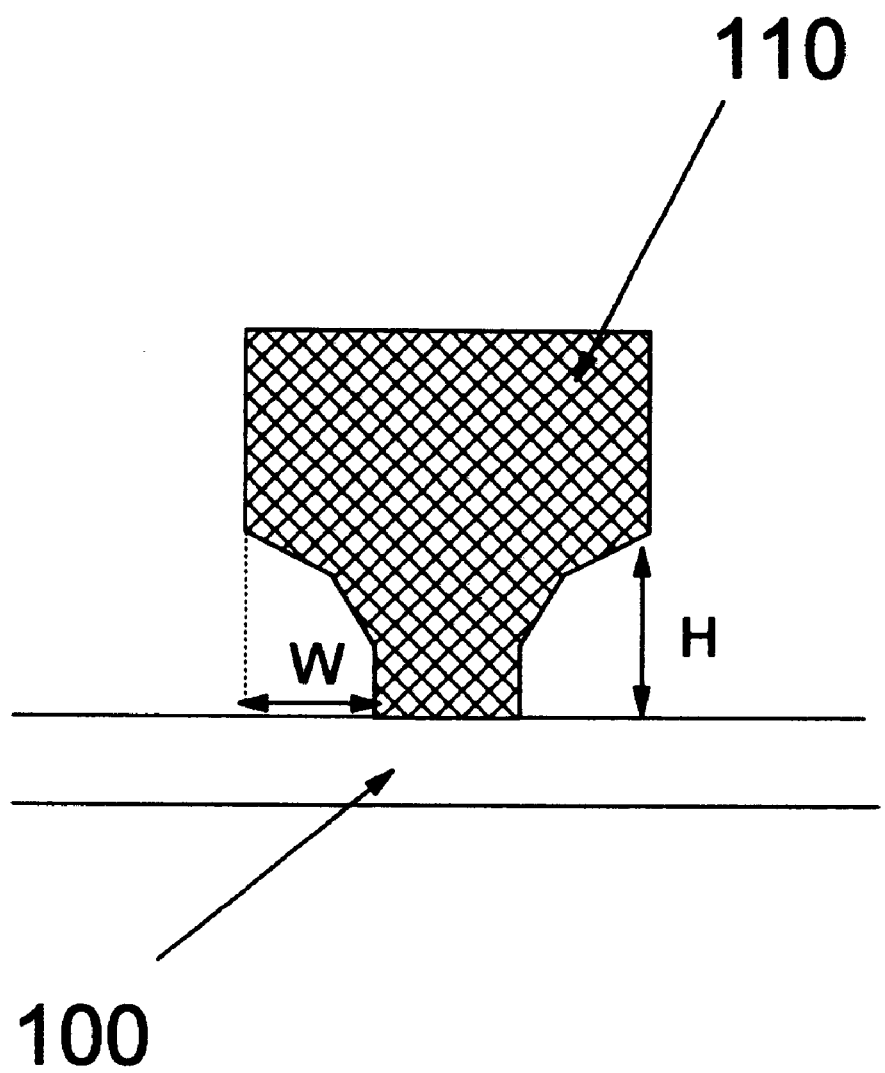
FIG. 1 shows a notch gate structure on a thin film SOI substrate with gate oxide layer separating the notch gate from the substrate.

FIG. 1 shows a Silicon-on-insulator (SOI) layer (100) with a notch gate stack (110) mounted thereon, wherein the notch width and height are referenced by "w" and "h" respectively. While the substrate of the invention is preferably SOI, the structure to be described hereinafter extends to any type of substrate. Although, the formation of notch gate structure is not part of the invention, details of its construction are found in U.S. patent application Ser. No. 09/811,707, filed concurrently, and which is incorporated herein by reference.

Figure 2:
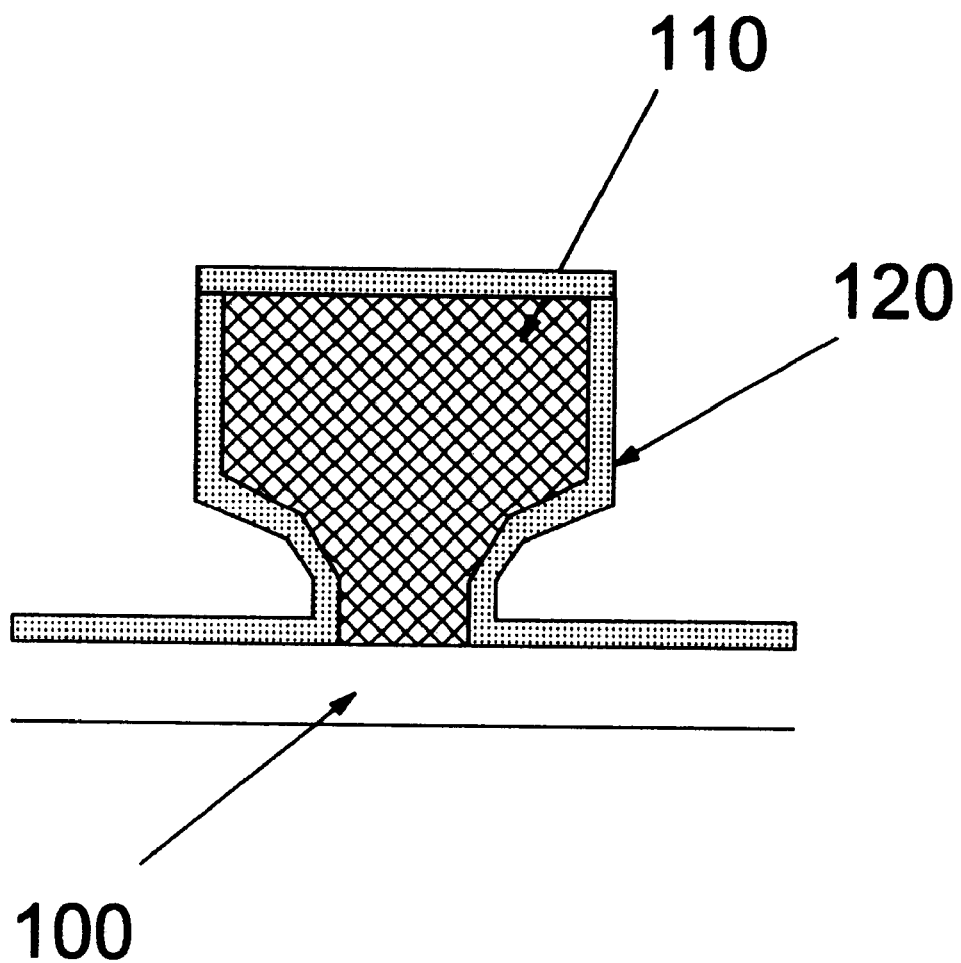
FIG. 2 shows a thin layer of dielectric conformally deposited on the notch gate and substrate.

Referring to FIG. 2, a dielectric thin film (120) envelops the entire structure. A common approach used for depositing a conformal film is by way of Chemical Vapor Deposition (CVD). CVD usually provides a conformal film because the process relies on chemical absorption of the gas onto the surface. Since chemical absorption is non-directional, the film deposited conforms to any surface. The conformality depends on temperature. For dielectrics such as oxide or nitride, temperatures above 700° C. give excellent conformality, with the dielectric filling up the entire notch cavity.

FIG. 3 shows the structure after performing a directional etch. The etch removes the dielectric on any exposed horizontal surface, including the top of gate (115) and source/drain area beyond the notch (116). Once the top film is etched away, the dielectric at the gate edge is exposed. Any over-etching will partially remove the gate edge film (e.g., 117), leaving a tapered shape as shown. The dielectric inside the notch is protected by the top part of the gate and therefore remains intact. In later steps, this dielectric (130) will be used as the hard mask of to perform a selective epitaxial growth.

Referring now to FIG. 4, a selective epitaxy is performed. Epitaxial silicon is grown on any exposed silicon surface but not on any other material such as oxide and nitride. The process preferably starts with an oxide wet strip that removes any oxide residue on the silicon surface. Then, the silicon epitaxy is grown using a low pressure CVD process. Corresponding gas species (e.g., silane, chlorine, etc.) are used in the CVD process so that the epitaxy grows only on the silicon surfaces. As a result, there is no silicon growth on the surface protected by dielectric (130). The portion of silicon (140) outside the notch area is therefore raised by the epitaxial process with thickness referenced as "x". At the same time, silicon is grown on top of the gate (110) as well, (i.e., 145).

The processes described thus far complete the formation of a raised source-drain area. Hereinafter, the remaining steps required to complete the fabrication of the MOSFET will be described.

Referring now to FIGS. 5, following the epitaxial growth, ion implantation is performed to define the source/drain region. The implantation is executed either with the dielectric (130) in place or removed, as shown in FIG. 5(a) and 5(b), respectively. Removing the remaining dielectric (130) allows for better during the ultra-low energy ion implantation process (e.g., below 7 keV). The implantation is exercised at 0° angle or at a tilted angle, or at any combination of both, in order to secure the best source/drain doping profile. The implantation creates source-drain region (150). After implantation, a selfaligned silicide(salicide) is formed to further minimize the parasitic resistance. There are two possible sequences to form the salicide.

In the first sequence and with reference to FIG. 6(a), a thick spacer (170) is constructed on the gate sidewall with the first spacer dielectric (130) in place. Alternately, it is performed with the dielectric fully removed, as illustrated in FIG. 6(b). Spacer (170) is formed by CVD nitride or oxide, followed by a directional etch to remove excess material from the top of the gate (110). Then, salicide (180) is formed using thick spacer (170) to prevent bridging effects.

Referring to FIG. 6(c), there is shown an implementation of the aforementioned second sequence. Salicide (180) is formed using dielectric (130) to prevent unwanted bridging. Practitioners in the art will readily appreciate that the second sequence has a disadvantage with respect to the first two, since the close proximity of the salicide on the source-drain regions and the top portion of the gate gives rise to unwanted parasitic capacitance.

The final raised source-drain formed with this invention has an offset, referenced by distance "D" from the MOSFET channel region. The distance is roughly equal to the sum of the dielectric thickness (130) and the notch width "w". Since the notch width is adjustable through the gate stack etching process, this offset distance can be adjusted to minimize the overlap capacitance while minimizing the parasitic series resistance. The distance the epitaxy facet to the notch upper corner is about h-x. To minimize the overlap capacitance, h is preferred to be larger than x. In order to minimize the parasitic series resistance, the distance D should be minimized. For good silicide contact resistance, the epi-silicon thickness "x" should be at least equal to the thickness of the silicide, which is usually around 20–30 nm.

While the invention has been described in terms of various embodiments, those skilled in the art will recognize that the invention can be practiced with changes and modifications thereto without departing from the spirit and the scope of the appended claims.

What is claimed is:

1. A method of forming a MOSFET device having a raised source-drain region, the method comprising the steps of:
   a) forming a notch gate on a top surface of a substrate;
   b) covering the notch gate and the top surface of substrate with a conformal dielectric film;
   c) etching the conformal dielectric film to expose an upper surface of the notch gate and selected exposed areas of the substrate;

d) selectively growing silicon on the etched surface of the notch gate and on the etched surface of the substrate;

e) implanting doping to form a drain-source area; and f) forming a salicide on the notch gate and on the drain-source area.

2. The method as recited in claim 1, wherein an offset distance from the notch gate to the raised source-drain area is approximately equal to the sum of the thickness of the conformal dielectric film and the width of the notch gate.

3. The method as recited in claim 1, wherein the width of the notch gate is adjustable by way of a gate stack etching process, and wherein as offset distance is adjusted to minimize overlap capacitance while minimizing the parasitic series resistance.

4. The method as recited in claim 1, wherein step d) a layer of silicon is selectively grown by way of an epitaxial process to reduce the drain to source resistance.

5. The method as recited in claim 3, wherein in order to minimize the overlap capacitance, the height of the notch gate is larger than the final thickness of the growing silicon.

6. The method as recited in claim 1, wherein between steps e) and g), the method further comprises forming spacers on the vertical walls of the notch gate.

7. The method as recited in claim 1, wherein following step d), the conformal dielectric film is totally removed.

8. The method as recited in claim 1, wherein step e) the source-drain implants are performed with a combination of 0° and tilted angles.

9. The method as recited in claim 6, further comprising implanting additional source-drain dopants.

10. The method as recited in step b) of claim 1, wherein the conformal dielectric film is $Si_3N_4$.

11. The method as recited in claim 6, wherein the spacer is made of $Si_3N_4$ or $SiO_2$.

12. The method as recited in step b) of claim 1, wherein the conformal dielectric film is deposited using a low pressure chemical-vapor deposition (CVD).

13. The method as recited in step d) of claim 1, wherein the selective silicon is epitaxially grown using Chemical-Vapor Deposition (CVD).

* * * * *